United States Patent [19]

Leung et al.

[11] 4,420,503
[45] Dec. 13, 1983

[54] LOW TEMPERATURE ELEVATED PRESSURE GLASS FLOW/RE-FLOW PROCESS

[75] Inventors: Chung W. Leung, Belle Mead; Robert H. Dawson, Princeton, both of N.J.; Martin A. Blumenfeld, Tequesta, Fla.; Dennis P. Biondi, Santa Ana, Calif.

[73] Assignee: RCA Corporation, New York, N.Y.

[21] Appl. No.: 379,103

[22] Filed: May 17, 1982

[51] Int. Cl.$^3$ ........................................... H01L 21/316
[52] U.S. Cl. ....................................... 427/85; 156/644; 156/662; 156/663; 427/93; 427/376.2
[58] Field of Search ........................ 427/85, 93, 376.2; 156/644, 662, 663

[56] References Cited

U.S. PATENT DOCUMENTS

| | | | |
|---|---|---|---|
| 3,481,781 | 12/1969 | Kern | 117/215 |
| 3,833,919 | 9/1974 | Naber | 357/71 |
| 3,925,572 | 12/1975 | Naber | 427/87 |
| 4,167,915 | 9/1979 | Toole et al. | 118/708 |
| 4,268,538 | 5/1981 | Toole et al. | 427/93 |
| 4,271,582 | 6/1981 | Shieai | 427/93 |
| 4,273,805 | 6/1981 | Dawson | 427/93 |
| 4,275,093 | 6/1981 | Sasaki et al. | 427/89 |
| 4,293,589 | 10/1981 | Tagaki et al. | 427/93 |
| 4,293,590 | 10/1981 | Tagaki et al. | 427/93 |
| 4,349,584 | 9/1982 | Flatley | 427/93 |
| 4,355,454 | 10/1982 | Tasch | 427/85 |
| 4,363,830 | 12/1982 | Hsw | 427/88 |

OTHER PUBLICATIONS

W. Kern, et al., "Chemical Vapor Deposition of Silicate Glasses For Use With Silicon Devices," *J. Electrochem. Soc.:* Electrochemical Technology, 117, Apr. 1970 (I-Deposition Techniques, pp. 562–568) and (II-Film Properties, pp. 568–573).

*Primary Examiner*—John D. Smith
*Attorney, Agent, or Firm*—Birgit E. Morris; Donald S. Cohen; Lawrence P. Benjamin

[57] ABSTRACT

A method of reducing the time and temperature for either flowing or re-flowing a glass layer on a semiconductor device is described. The method involves conducting the flow or re-flow process steps at an elevated pressure which reduces both the time and the temperature required to achieve proper flow and re-flow characteristics.

9 Claims, No Drawings

LOW TEMPERATURE ELEVATED PRESSURE GLASS FLOW/RE-FLOW PROCESS

BACKGROUND OF THE INVENTION

This invention relates, in general, to semiconductor processing and, more particularly, to a process for flowing and or re-flowing doped insulator layers utilized in the manufacture of semiconductor devices.

In the manufacture of semiconductor devices it is usually necessary, at least once during the process, to heat an insulating layer in order to cause the layer to soften and "flow". One example of such a flow step is detailed in U.S. Pat. No. 3,833,919 which issued on Sept. 3, 1974 and in U.S. Pat. No. 3,925,572 which issued on Dec. 9, 1975, both to C. T. Naber. In both references an undoped silicon dioxide ($SiO_2$) insulator layer is deposited on a lower level of conductors and a layer of heavily doped $SiO_2$ is formed over the undoped layer. The doped layer, when heated, will soften and flow at about 1000° C. the flow temperature being heavily dependent on the concentration of the dopant in the doped layer. However, the temperature is sufficiently lower than 1300° C. required to cause the undoped layer to soften and flow.

Similarly, it is frequently necessary to reheat a layer that was made to flow and thus cause it to "re-flow." This re-flow process is often necessary when, after etching the flow layer to form contact openings, the re-flow process step rounds the sharp edges formed in the glass. Thus, some important reasons for utilizing low flow and re-flow temperatures is (1) to minimize the possibility of diffusing the dopant out of the heavily doped $SiO_2$ layer and into the substrate and (2) to minimize source-drain side diffusion to thus produce longer electrical channel lengths. Conversely, over-shortening of the channel length is minimized.

Another beneficial effect of using lower flow/re-flow temperatures is the resultant enhanced radiation tolerance that the device exhibits. This latter benefit is described in detail in U.S. Pat. No. 4,259,779 which issued on Apr. 7, 1981 to A. C. Ipri, et al. This patent describes a method of making a radiation hardened (RAD hard) transistor by forming the channel oxide at a temperature under 1000° C. and thereafter performing the remaining process steps at or below 900° C. Thus, the need for a low temperature semiconductor manufacturing process is of importance to the semiconductor manufacturing industry.

SUMMARY OF THE INVENTION

In accordance with the teachings of our invention herein described, the prior art deficiencies are overcome by utilizing a high pressure environment to further reduce both the required temperature and time for the flow and re-flow steps utilized in processing devices.

DETAILED DESCRIPTION OF THE INVENTION

It should be noted that, while the following process description will be described in terms of a process for manufacturing a bulk silicon device, we do not wish to be so limited. It will be obvious to those skilled in the art that similar processing steps may be applied to devices wherein a silicon body is first formed on an insulating carrier such as sapphire, generically referred to as silicon-on-sapphire (SOS). While sapphire is preferred, other similar insulators such as spinel or monocrystalline beryllium oxide may be used. Similarly, recrystallized polycrystalline silicon over silicon dioxide may also be used.

In carrying out the basic form of our invention, one should, preferably, have progressed in the formation of the particular device, at least to the point where one will ultimately deposit the metallic interconnects or pad connections. To prepare for the formation of interconnects the device is first provided in certain instances with a barrier layer followed by an appropriate insulating layer such as a phosphosilicate glass having about 5–7 wt % P (6% PSG). Typically, the prior art deposits this 6% PSG using a chemical vapor deposition technique at atmospheric pressure and includes simultaneously passing a mixture of phosphine diluted in nitrogen, silane diluted in nitrogen and oxygen over the wafer to be coated while maintaining the wafer at a temperature about 400°±50° C. It should also be noted that while we describe the wafer processing in terms of using a 6% PSG insulating layer, other types of glasses may be used. One such other glass is a family of borophosphosilicate ternary glasses (BPSG) as described in U.S. Pat. No. 3,481,781, which issued to W. Kern on Dec. 2, 1969, and assigned to the same assignee as the subject application. In an article "Chemical Vapor Deposition of Silicate Glasses For Use With Silicon Devices" by W. Kern et al., *J. Electrochem Soc.:* Electrochemical Technology, 117, Apr. 1970, (I-Deposition Techniques, pp. 562–568) and (II-Film Properties, pp. 568–573) there are the initial discussions of the use and method of forming the BPSG layers. One method for lowering the flow/re-flow characteristics of BPSG glasses is to introduce steam during the flow/re-flow heating step. Such a method is described in application Ser. No. 258,431, filed Apr. 28, 1981 by D. W. Flatley, et al., entitled "PROCESS FOR TAPERING OPENINGS IN GLASS COATINGS" and assigned to the same assignee as the subject application. These BPSG layers may also be used in our high pressure processing as it has been found that positive photoresists will adhere better to BPSG than negative photoresist.

After formation of the layer of insulating glass, the wafer is removed from the deposition chamber and is suitably masked and etched to provide the necessary via apertures and pad openings. Once the appropriate openings are formed in the PSG (or BPSG) layer, the wafer is inserted into a pressure chamber and the ambient pressure is raised from atmospheric pressure to about 10 atmospheres. The wafer is then heated and it has been found that a temperature of the order of about 850° C. will produce the required glass flow in about 10–15 minutes.

As an alternative method it should now be obvious that this glass flowing step may also be done in two steps if a re-flow process step is desired. In this latter case as soon as the insulating glass layer is formed on the wafer, the wafer is then subjected to a high pressure "flow" step after which it is removed from the pressure chamber, masked and etched to form the appropriate vias and contact openings. The wafer is then returned to the pressure chamber where the pressure is raised, heated to about 850° C. where the "re-flow" process will now futher contour any sharp corners that may have been formed by the second etching step.

Thus, by using our high pressure ambient flow/re-flow technique, it should be obvious that by a still higher pressure in the chamber, one is able to use a lower temperature and shorter time to achieve the desired flow characteristics. A lower pressure will require a longer period of time and somewhat higher temperature. Therefore, we do not wish to be limited to the specific example cited.

Accordingly, by using a high pressure technique for the flow or re-flow steps we are able to manufacture a short channel device that minimizes the possibility of lateral diffusion by using lower temperatures and, by the same token, our process is able to achieve good flow characteristics in a relatively lightly doped insulating layer.

What is claimed is:

1. A process for forming tapered apertures in a glass layer of a semiconductor device comprising the steps of:
    forming the glass layer;
    forming apertures in the glass layer;
    maintaining the glass layer at an elevated pressure above atmospheric pressure;
    heating the glass layer at the elevated pressure; and
    maintaining the heated glass layer at the elevated pressure for a period of time sufficient to only soften the layer and taper the edges of the apertures.

2. The process of claim 1, wherein: the glass layer is maintained at a pressure of about 10 atmospheres or greater during the heating step.

3. The process of claim 2, wherein:
    the glass layer is a doped glass selected from the group consisting of phosphosilicate glass doped with and a ternary borophosphosilicate glass doped with both B and P.

4. The process of claim 3, wherein:
    the doped glass layer is heated to a temperature of about 850°±50° C.

5. The process for flowing a glass layer of a semiconductor device, comprising the steps of:
    forming the glass layer;
    maintaining the glass layer at an elevated pressure above atmospheric pressure;
    heating the glass layer at the elevated pressure; and
    maintaining the heated glass layer at the elevated pressure for a period of time sufficient to only bring the glass layer to its softening point whereby the glass layer is caused to flow.

6. The process of claim 5, comprising the further steps of:
    forming an apertured mask on the surface of the glass layer;
    etching the exposed portions of the glass layer;
    maintaining the etched glass layer at the elevated pressure; and
    heating the glass layer at the elevated pressure for a period of time sufficient to only soften the layer and taper the edges of the etched apertures.

7. The process of claim 6, wherein:
    the glass layer is maintained at a pressure of about 10 atmospheres or greater during the heating step.

8. The process of claim 7, wherein:
    the glass layer is a doped glass selected from the group consisting of a phosphosilicate glass doped with P and a ternary borophosphosilicate glass doped with B and P.

9. The process of claim 8, wherein:
    the doped glass layer is heated to a temperature of about 850°±50° C.

* * * * *

UNITED STATES PATENT AND TRADEMARK OFFICE
CERTIFICATE OF CORRECTION

PATENT NO. : 4,420,503

DATED : December 13, 1983

INVENTOR(S) : Chung Wai Leung et al.

It is certified that error appears in the above-identified patent and that said Letters Patent is hereby corrected as shown below:

Column 2, line 65: "futher" should be --further--.

Claim 3, line 4: after "with" a --P-- should be inserted.

Signed and Sealed this

Seventh Day of February 1984

[SEAL]

Attest:

GERALD J. MOSSINGHOFF

Attesting Officer     Commissioner of Patents and Trademarks